(12) United States Patent
Duong

(10) Patent No.: US 9,916,889 B1
(45) Date of Patent: Mar. 13, 2018

(54) MEMORY CIRCUITRY WITH ROW-WISE GATING CAPABILITIES

(71) Applicant: Intel Corporation, Santa Clara, CA (US)

(72) Inventor: Kenneth Duong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/366,951

(22) Filed: Dec. 1, 2016

(51) Int. Cl.
*G11C 7/10* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/419; G11C 11/418
USPC .................. 365/154, 189.16, 230.05, 230.06
See application file for complete search history.

(56) References Cited

U.S. PATENT DOCUMENTS

| | | | |
|---|---|---|---|
| 4,852,060 A | 7/1989 | Rockett, Jr. | |
| 5,307,142 A | 4/1994 | Corbett et al. | |
| 5,331,164 A | 7/1994 | Buehler et al. | |
| 5,504,703 A | 4/1996 | Bansal | |
| 5,631,863 A | 5/1997 | Fechner et al. | |
| 6,275,080 B1 | 8/2001 | Phan et al. | |
| 6,900,999 B1* | 5/2005 | Yen | G11C 15/04 365/168 |
| 6,975,041 B2 | 12/2005 | Hirano et al. | |
| 7,092,309 B2 | 8/2006 | Liaw | |
| 7,193,887 B2 | 3/2007 | Wood | |
| 7,233,518 B2 | 6/2007 | Liu | |
| 7,352,610 B1 | 4/2008 | Pedersen et al. | |
| 7,366,006 B2 | 4/2008 | Zhang | |
| 7,872,903 B2 | 1/2011 | Pedersen | |
| 7,920,410 B1 | 4/2011 | Lee et al. | |
| 8,018,788 B2* | 9/2011 | Jung | G11C 11/412 365/154 |
| 2002/0130348 A1 | 9/2002 | Tran | |
| 2005/0259462 A1 | 11/2005 | Wood | |

(Continued)

OTHER PUBLICATIONS

Calin et al., "Upset Hardened Memory Design for Submicron CMOS Technology", IEEE Transactions on Nuclear Science, vol. 43, No. 6, Dec. 1996.

(Continued)

*Primary Examiner* — Vu Le
(74) *Attorney, Agent, or Firm* — Treyz Law Group, P.C.; Jason Tsai

(57) ABSTRACT

An integrated circuit that includes an array of random-access memory cells is provided. Each memory cell in the array may be a single-port or a multiport memory cell. Memory cells in the same column of the array are connected to shared bit lines, whereas memory cells in the same row of the array are connected to shared word lines. The memory cells in the same row may also be connected to a row control line. During normal operations, the row control line may provide a positive power supply voltage to each memory cell along that row. During write operations, the row control line may be driven to ground or tri-stated to help improve the write margin and the write performance of the selected memory cells. The aspect ratio of these memory cells may also be more square-like or balanced to help improve power delivery.

14 Claims, 7 Drawing Sheets

(56) References Cited

U.S. PATENT DOCUMENTS

| | | |
|---|---|---|
| 2006/0262612 A1 | 11/2006 | Lovett |
| 2007/0041242 A1 | 2/2007 | Okazaki et al. |
| 2007/0236983 A1* | 10/2007 | Wang .................... G11C 11/419 365/154 |
| 2008/0087927 A1 | 4/2008 | Shin et al. |
| 2016/0224082 A1* | 8/2016 | Ohsawa ............. G11C 14/0081 |

OTHER PUBLICATIONS

Rahim et al. U.S. Appl. No. 61/113,573, filed Nov. 11, 2008.
Ku et al. U.S. Appl. No. 61/113,576, filed Nov. 11, 2008.
Rahim et al. U.S. Appl. No. 61/120,334, filed Dec. 5, 2008.
Xu et al. U.S. Appl. No. 61/101,998, filed Oct. 1, 2008.
Rahim et al. U.S. Appl. No. 61/102,000, filed Oct. 1, 2008.
Rahim et al. U.S. Appl. No. 61/102,003, filed Oct. 1, 2008.

* cited by examiner

MEMORY CIRCUITRY WITH ROW-WISE GATING CAPABILITIES

BACKGROUND

This relates to integrated circuits and, more particularly, to integrated circuits that contain memory.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters. In each memory cell, the cross-coupled inverters are connected to one or more access transistors that are turned on when data is being read from or written into the memory element. When no data is being read from or written into the memory element, the access transistors are turned off to isolate the memory element.

As semiconductor technology scales towards smaller dimensions, lower power supply voltages may be used to power integrated circuits. Lower power supply voltages and smaller devices may lead to decreased read and write margins for volatile memory elements. This can pose challenges for reliable device operation.

It is within this context that the embodiments described herein arise.

SUMMARY

An integrated circuit that includes a row-wise gated 8T register file is provided. It is appreciated that the present invention can be implemented in numerous ways, such as a process, an apparatus, a system, a device, or a method on a computer readable medium. Several inventive embodiments of the present invention are described below.

The register file may include an array of memory cells arranged in rows and columns. Each memory cell may include cross-coupled inverters having a power supply terminal and associated write/read ports. Power supply gating circuitry may provide a gated power supply voltage to the power supply terminal of the inverters in each memory cell. During normal operations, the power supply gating circuitry may provide a positive power supply voltage to the power supply terminal. During write operations, the power supply gating circuitry may provide a ground voltage or may tri-state the power supply terminal on a per-row basis. Tri-stating the power supply terminal may at least partially cut off a pull-up current path for a selected row of memory cells.

In one suitable arrangement, a word line may be generated for the selected row of memory cells by simply delaying and inverting the output of the power supply gating circuitry. In another suitable arrangement, the word line may be used to control a common pull-up switch that is shared among a row of memory cells.

The memory cells may also have a balanced aspect ratio that is substantially square-like. As examples, the aspect ratio of each memory cell may be less than 2:1, less than 1.5:1, or less than 1.2:1. Moreover, each memory cell may have its power supply gating node (e.g., the node that directly receives the gated power supply voltage from the power supply gating circuitry) formed near the center and away from the edges of the memory cell to help enable power supply gating on a row-by-row basis.

Further features of the invention, its nature and various advantages will be more apparent from the accompanying drawings and following detailed description.

DETAILED DESCRIPTION

Embodiments of the present invention relate to integrated circuit memory elements that exhibit improved write margins. The memory elements, which are sometimes referred to as cells, may contain any suitable number of transistors. For example, a memory cell may include two cross-coupled inverting circuits, three cross-coupled inverting circuits, four cross-coupled inverting circuits, or more than four cross-coupled inverting circuits that are coupled to one or more access transistors. If desired, the voltage levels that are associated with power supply signals, control signals, transistor body biasing signals, and/or data signals for the memory cells can be adjusted in real time to enhance performance.

It will be recognized by one skilled in the art, that the present exemplary embodiments may be practiced without some or all of these specific details. In other instances, well-known operations have not been described in detail in order not to unnecessarily obscure the present embodiments.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, memory elements 20 perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
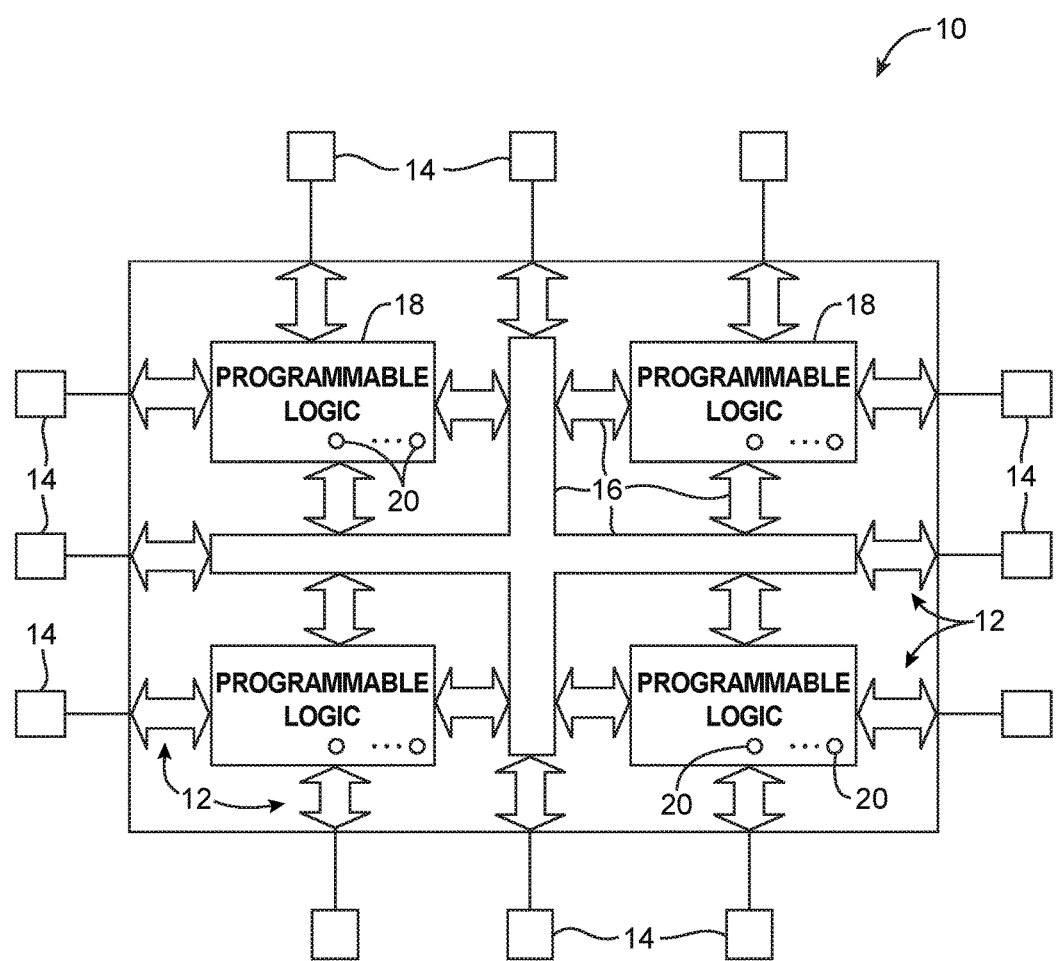
FIG. 1 is a diagram of an illustrative programmable integrated circuit in accordance with an embodiment.

An illustrative integrated circuit such as a programmable logic device 10 is shown in FIG. 1. Device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input-output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

Figure 2:
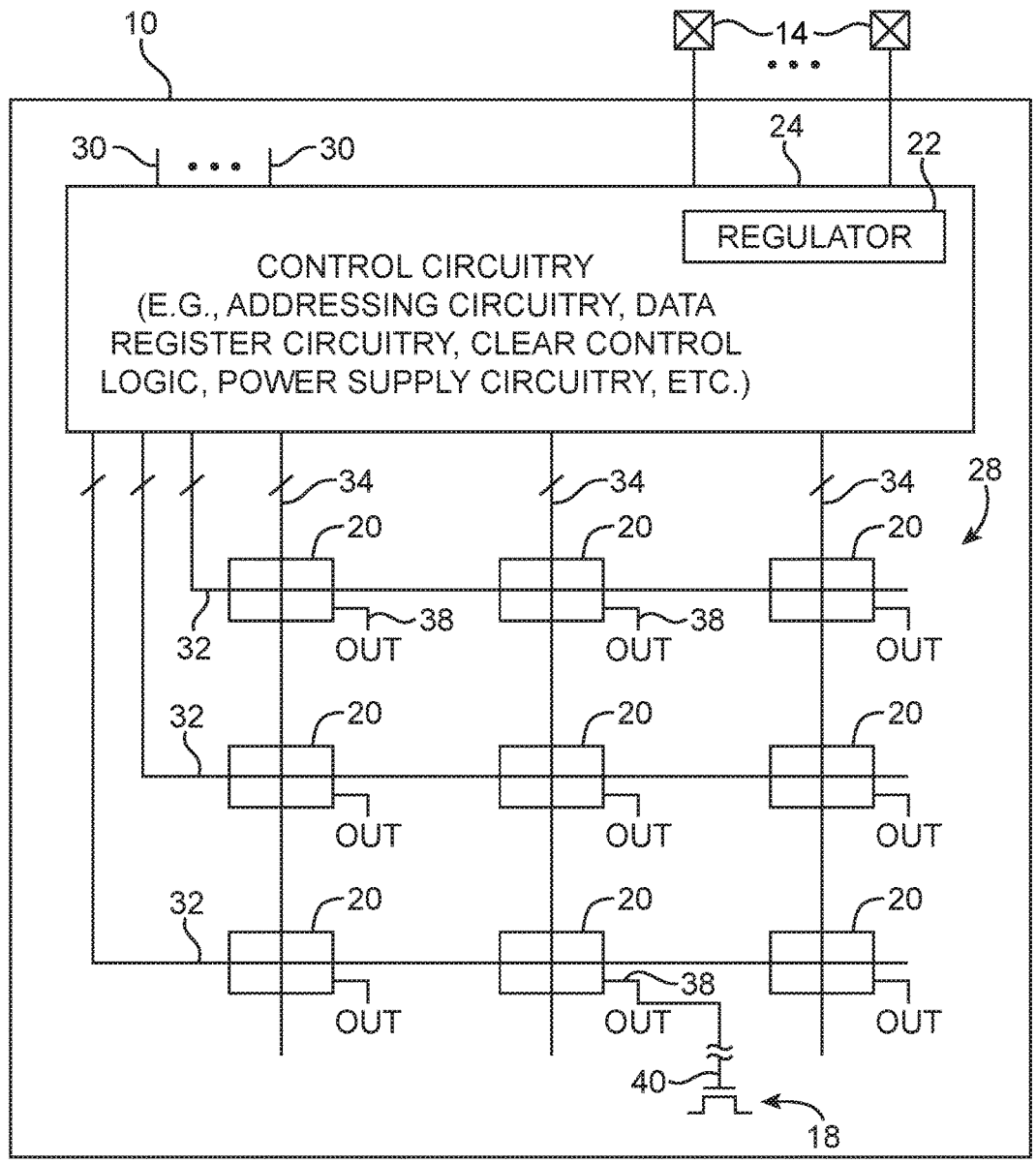
FIG. 2 is a diagram of an illustrative array of memory cells in accordance with an embodiment.

When memory elements 20 are arranged in an array, horizontal and vertical conductors and associated loading circuitry may be used to load the memory elements with configuration data. Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Each memory element may supply a corresponding output signal OUT at a corresponding output path 38. In CRAM arrays, each signal OUT is a static output control signal that may be conveyed over a path 40 and used in configuring a corresponding transistor such as transistor 18 or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data register circuitry, and/or clear control circuitry. Regulator 22 may be used to produce time-varying power supply voltages. These power supply voltages may be of the same magnitude as the voltages received on pins 14 or may have different magnitudes than the voltage received from pins 14. Control circuitry 24 (e.g., the addressing circuitry, data register circuitry, clear control circuitry, and other control circuitry of circuitry 24) can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have one or more associated address lines in a respective one of paths 32 that carries a corresponding address signal (as an example). The address lines are sometimes referred to as a word lines, and the address signals are sometimes referred to as word line signals. Each column of array 28 may have one or more associated data lines in a respective one of paths 34 on which data signals are provided. The data lines are sometimes referred to as bit lines, and the data signals are sometimes referred to as bit line signals. If desired, other patterns of lines may be used in paths 32 and 34. The signals that are supplied to memory elements 20 may sometimes be collectively referred to as control signals. In particular contexts, some of these signals may be referred to as power signals, clear signals, data signals, address signals, etc. These different signal types are not mutually exclusive.

Figure 3:
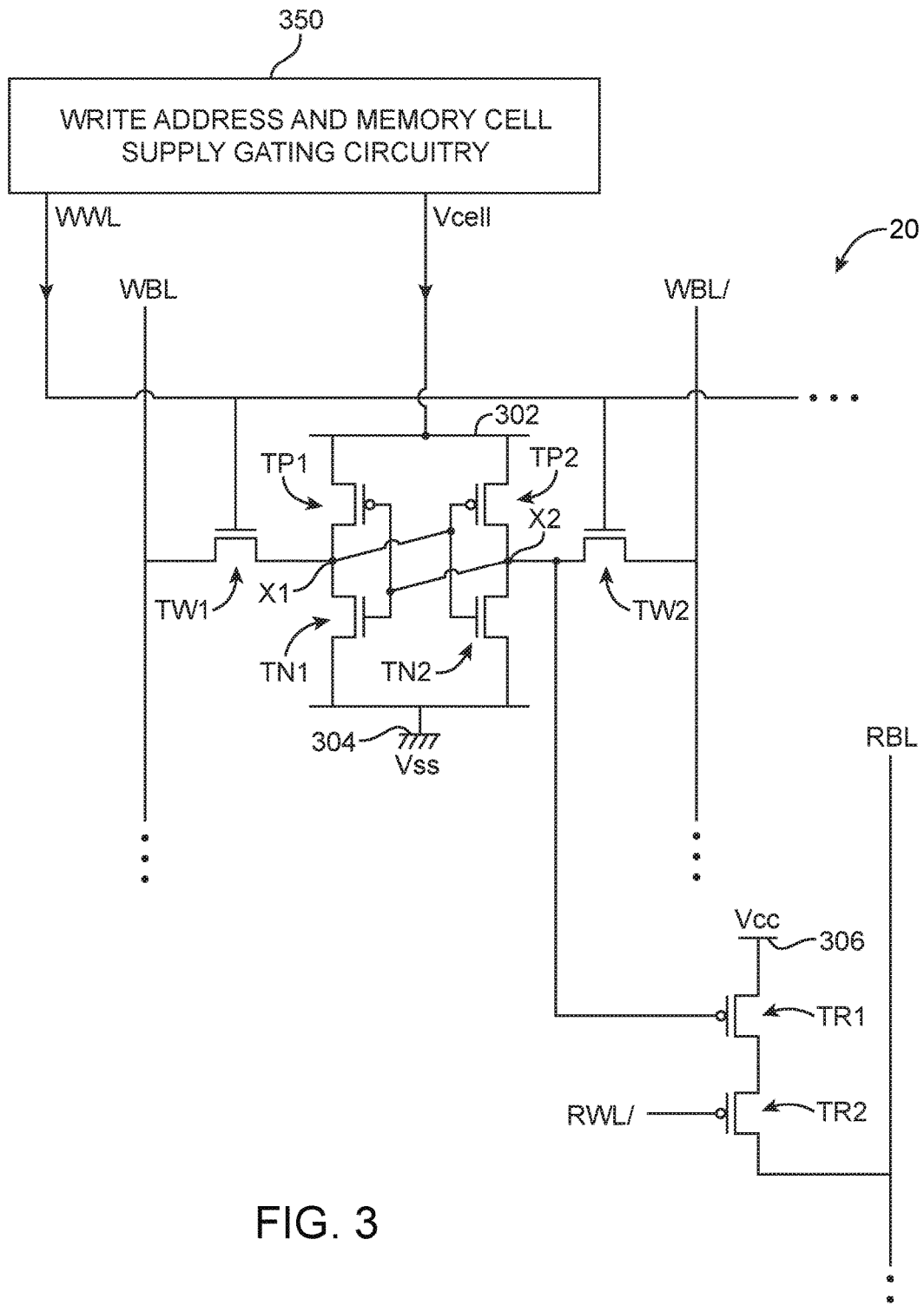
FIG. 3 is a diagram of a memory cell that can be controlled using illustrative row-wise power supply gating circuitry in accordance with an embodiment.

FIG. 3 shows one suitable circuit implementation of memory cell 30. As shown in FIG. 3, memory cell 20 may include a bistable element that is formed from a pair of cross-coupled inverters. In particular, the first inverter may include p-channel transistor TP1 and n-channel transistor TN1 coupled in series between a memory cell power supply line 302 (e.g., a power supply line on which memory cell power supply voltage Vcell is provided) and a ground power supply line 304 (e.g., a power supply line on which ground power supply voltage Vss is provided). The second inverter may include p-channel transistor TP2 and n-channel transistor TN2 coupled in series between power supply lines 302 and 304. N-channel transistors TN1 and TN2 may be referred to as memory cell "pull-down" transistors, whereas p-channel transistors TP1 and TP2 may be referred to as memory cell "pull-up" transistors.

In forming the bistable element, the input of the first inverter may be coupled to the output of the second inverter, whereas the input of second inverter may be coupled to the output of the first inverter. The output of the first inverter may serve as a first internal data storage node X1 for cell 20 while the output of the second inverter may serve as a second internal data storage node X2 for cell 20. The bistable storage portion of memory cell 20 configured in this way may be used to store a single bit of data (e.g., the first and second internal data storage nodes may store true and complement versions of a single data bit, respectively).

A first write bit line WBL and a second write bit line WBL/(sometimes referred to as true and complementary data lines, respectively) may be used in load data into memory cell 20 using differential write access/address transistors TW1 and TW2. In general, the terms "bit lines" and "data lines" can be used interchangeably. When it is desired to write data into the bistable memory cell, data may be placed on bit line WBL and a complementary version of the data may be placed on complementary bit line WBL/. Write word line (or address) signal WWL may then be asserted to load the data into the bistable memory element. During normal operation, write address signal WWL may be deasserted and the data on node X2 may be used as an output.

Memory cell 200 may also include a read buffer transistor TR1 and a read access/address transistor TR2 that serve collectively as a read circuit (sometimes referred to as a "read buffer circuit") for reading data from node X2 via read bit line RBL. In particular, transistor TR1 may be a p-channel transistor that includes a gate terminal that is connected to memory output node X2, a source terminal that is coupled to positive power supply line 306 (e.g., a positive power supply line on which positive power supply signal Vcc is provided), and a drain terminal. Transistor TR2 may also be a p-channel transistor that includes a gate terminal that receives a read word line (or address) signal RWL, a source terminal that is coupled to the drain terminal of transistor TR1, and a drain terminal that is coupled to read bit line RBL. The read buffer circuit may be implemented using p-channel transistors to help provide a better balance between n-channel and p-channel transistors in the memory array.

When it is desired to read data from memory cell 20, read address signal RWL can be asserted (e.g., driven low) to turn on read address transistor TR2. In response to asserting RWL, the voltage on the read bit line RBL may start to rise depending on the value of the stored content at node X2 (assuming the read bit line is normally pre-discharged prior to a read operation). For example, if node X2 is low, transistor TR1 will be activated and will pull the voltage on read bit line RBL towards Vcc. As another example, if node X2 is high, transistor TR1 will be turned off, and the voltage on read bit line RBL will remain low. During normal operation, read word line signal RWL may be deasserted.

In general, a write word line WWL may be coupled to memory cells 20 arranged along the same row in the memory array to selectively activate an entire row in the array, whereas the write/read bit lines are coupled to memory cells 20 arranged along the same column in the array. The terms "row" and "column" used in this context is merely illustrative. If desired, these terms can be used interchangeably when referring to memory cells arranged in an array.

The exemplary memory cell 20 of FIG. 3 includes only eight transistors and is therefore sometimes referred to as an "8T" memory cell. The 8T memory cell of FIG. 3 has a dedicated write port (e.g., a write port that loads data into cell 20 using write access transistors TW1 and TW2 and write bit lines WBL and WBL/) and a separate read port (e.g., a read port that reads data from cell 20 using read access transistors TR1 and TR2 and read bit line RBL). A multiport memory cell of this type is often used as a building block of memory circuitry such as register files.

The separate read port helps to dramatically improve read margin. As integrated circuit technology scales towards smaller dimensions and lower voltages, however, the write margin of the memory cell continues to degrade. The write margin is dependent on the inherent drive fight between pull-up transistors TP1 and TP2 and write access transistors TW1 and TW2. Conventional write assist techniques, which include overdriving the write access transistors at an elevated voltage level, may no longer be sufficient to satisfy write performance requirements.

In accordance with an embodiment, the inherent drive fight between pull-up transistors TP1 and TP2 and write access transistors TW1 and TW2 can be removed by gating the power supply of the memory cell. In particular, the power supply of the memory cells in the array can be gated on a per-row basis during the write operations. Still referring to FIG. 3, memory cell 20 may have its word line WWL and cell power supply line 302 coupled to control circuitry such as write address and memory cell supply gating circuitry 350. During write operations, circuitry 350 may serve to assert the write word line signal and also to gate memory cell power supply line 302 (e.g., to drive cell power supply voltage Vcell towards ground or to let voltage Vcell float). By gating power supply line 302, the strength of the feedback pull-up transistors TP1 and TP2 is dramatically reduced without weakening the drive strength of the write access transistors, thereby making it much easier to write in the desired data values and improve write margin/performance. Also, gating the cell power supply voltage on a row-by-row basis (i.e., only when a selected row is being accessed) ensures that data is properly retained or held in all of the memory cells in the non-selected rows.

Figure 4:
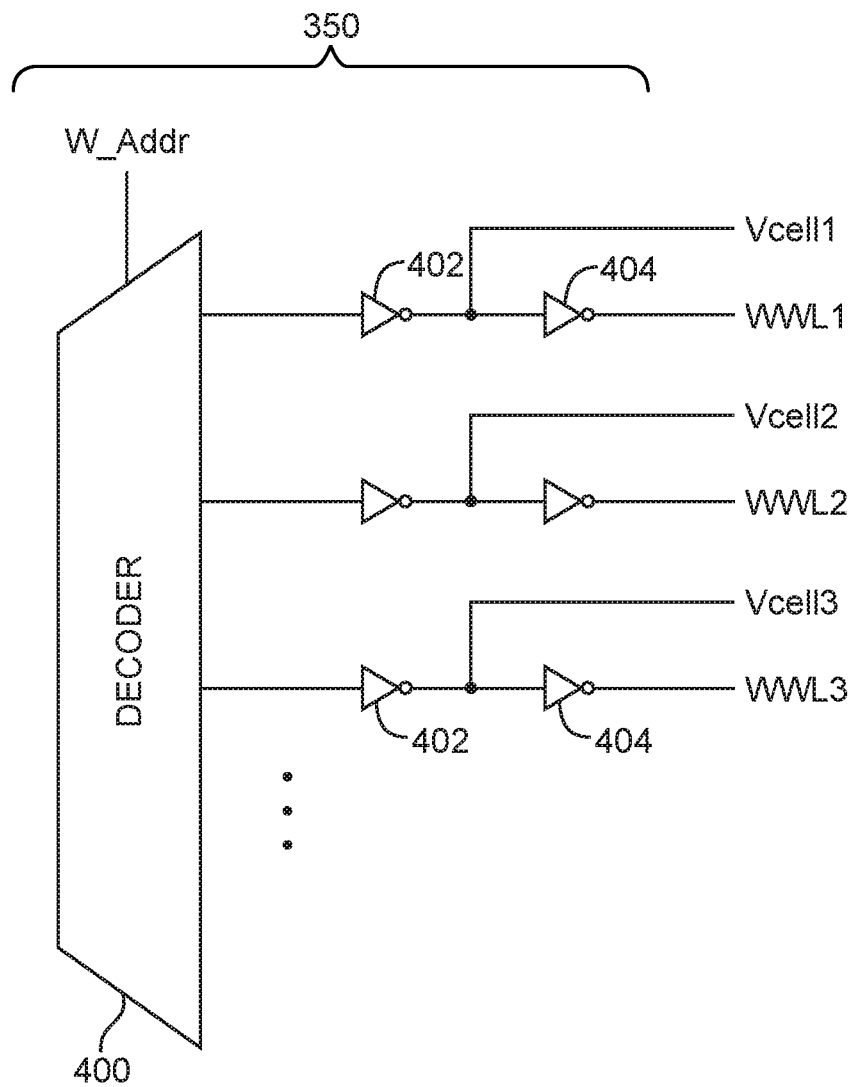
FIG. 4 is a diagram showing one suitable implementation of the row-wise power supply gating circuitry of FIG. 3 that drives the memory supply to ground during data loading operations in accordance with an embodiment.

FIG. 4 is a diagram showing one suitable implementation of row-wise power supply gating circuitry 350 of FIG. 3 that drives the cell memory supply to ground during data loading operations. Circuitry 350 may include a write address decoder 400 that receives a write address signal W_Addr and that outputs corresponding word line signals. Depending on the value of write address signal W_Addr, only a selected one or the word line signals will be asserted. The number of word line signals generated by decoder 400 is generally equal to the number of bits in address W_addr to the power of two. For example, if address W_Addr includes seven bits, decoder 400 may be capable of supporting 128 word lines (i.e., 2^7=127). As another example, if address W_Addr includes 10 bits, decoder 400 may be capable of supporting 1024 word lines (i.e., 2^10=1024).

As shown in FIG. 4, each output of decoder 400 may include a first inverter 402 and a second inverter 404. Inverters 402 and 404 may be connected in series, in that order. The memory cell supply voltage for the first row (Vcell1) may be generated at the output of inverter 402 in the first row, whereas the word line signal for the first row (WWL1) may be generated at the output of inverter 404 in the first row. Similarly, the memory cell supply voltage for the second row (Vcell2) may be generated at the output of inverter 402 in the second row, whereas the word line signal for the second row (WWL2) may be generated at the output of inverter 404 in the second row. Memory cell supply voltage Vcell3 and word line signal WWL3 in the third row and for all other rows may also be generated in this way.

Configured as such, whenever a selected one of the word line signals is asserted (i.e., driven high to a logic "1"), the memory cell voltage Vcell1 in that row will also be deasserted (i.e., driven low to a logic "0"). Moreover, the deassertion of Vcell will precede the assertion of the corresponding word line signal by some duration that is equal to the delay of inverter 404 at the beginning of the write cycle. At the end of the write cycle, Vcell will be re-asserted first to effectively re-activate or "wake up" the selected memory cell in the desired written state before subsequently turning off the write word line. This particular implementation of row-wise memory cell supply gating circuitry 350 is effective since collapsing the memory cell supply during write operations completely de-activates the pull-up transistors TP1 and TP2 without affecting the drive-ability of write access transistors TW1 and TW2.

Figure 5:
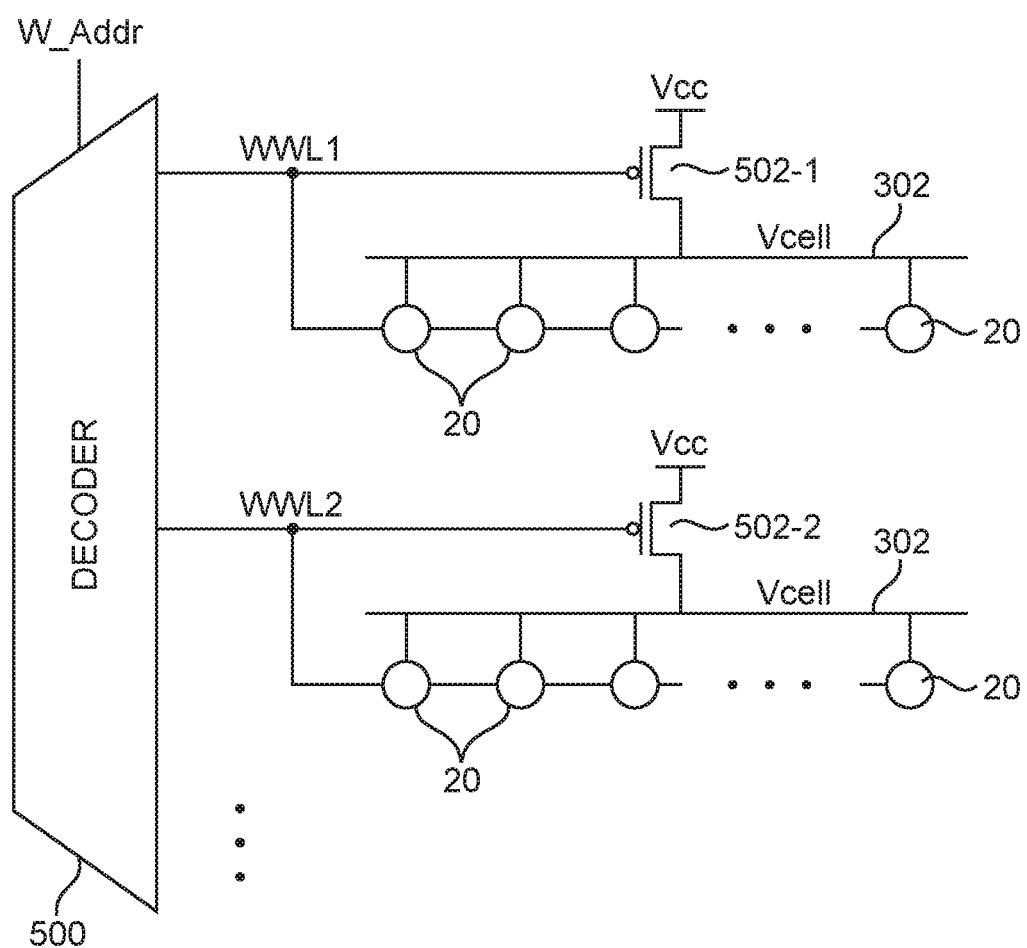
FIG. 5 is a diagram showing one suitable implementation of the row-wise power supply gating circuitry of FIG. 3 that floats the memory supply in a tri-state mode during data loading operations in accordance with an embodiment.

The implementation of FIG. 4 in which the memory cell supply is selectively driven to ground during write operations is merely illustrative and does not serve to limit the scope of the present embodiments. FIG. 5 shows another suitable implementation of row-wise power supply gating circuitry 350 that floats the memory supply in a tri-state mode during write operations. As shown in FIG. 5, circuitry 350 may include write address decoder 500 and multiple pull-up switching transistors 502. Each row of memory cells 20 in the array may be connected to a common respective row-wise power supply line 302, which is connected to the positive power supply line (e.g. a positive power supply line that is biased to voltage Vcc or greater) via a corresponding shared pull-up transistor 302.

For example, a first row of memory cells 20 may have a common cell power supply line 302 that is connected to a first shared pull-up transistor 502-1. A second row of memory cells 20 may have a common cell power supply line 302 that is connected to a second shared pull-up transistor 502-2. Other remaining rows may also be similarly configured. To access the first row of memory cells 20, word line signal WWL1 may be asserted to turn on the corresponding write access transistors in the memory cells along that row, which will also turn off pull-up transistor 502-1. Turning off pull-up transistor 502-1 effectively tri-states node 302 in the first row, which cuts off the direct pull-up drive path, thereby preventing power supply line 302 in the first row from being actively driven to Vcc. To access the second row of memory cells 20, word line signal WWL2 may be selectively asserted to turn on the corresponding write access transistors in the memory cells along the second row, which will turn off pull-up transistor 502-2. Turning off pull-up transistor 502-2 will electrically float node 302 in the second row, which cuts off the direct pull-up drive path by preventing power supply line 302 in the second row from being actively driven to Vcc.

Conventional memory cell layout typically places the power supply rails along the border of each memory cell so that the power supply rails can be shared when the memory cells are mirrored and duplicated across the entire array. Forming the power supply rails only at the borders or each memory cell enables the sharing of power supply lines between adjacent memory cells, which helps to reduce the effectively memory cell area. Moreover, conventional memory cell layout tends to be substantially elongated, as shown in FIG. 9 of commonly-assigned U.S. Pat. No. 7,872,903, which is hereby incorporated by reference in its entirety.

Figure 6:
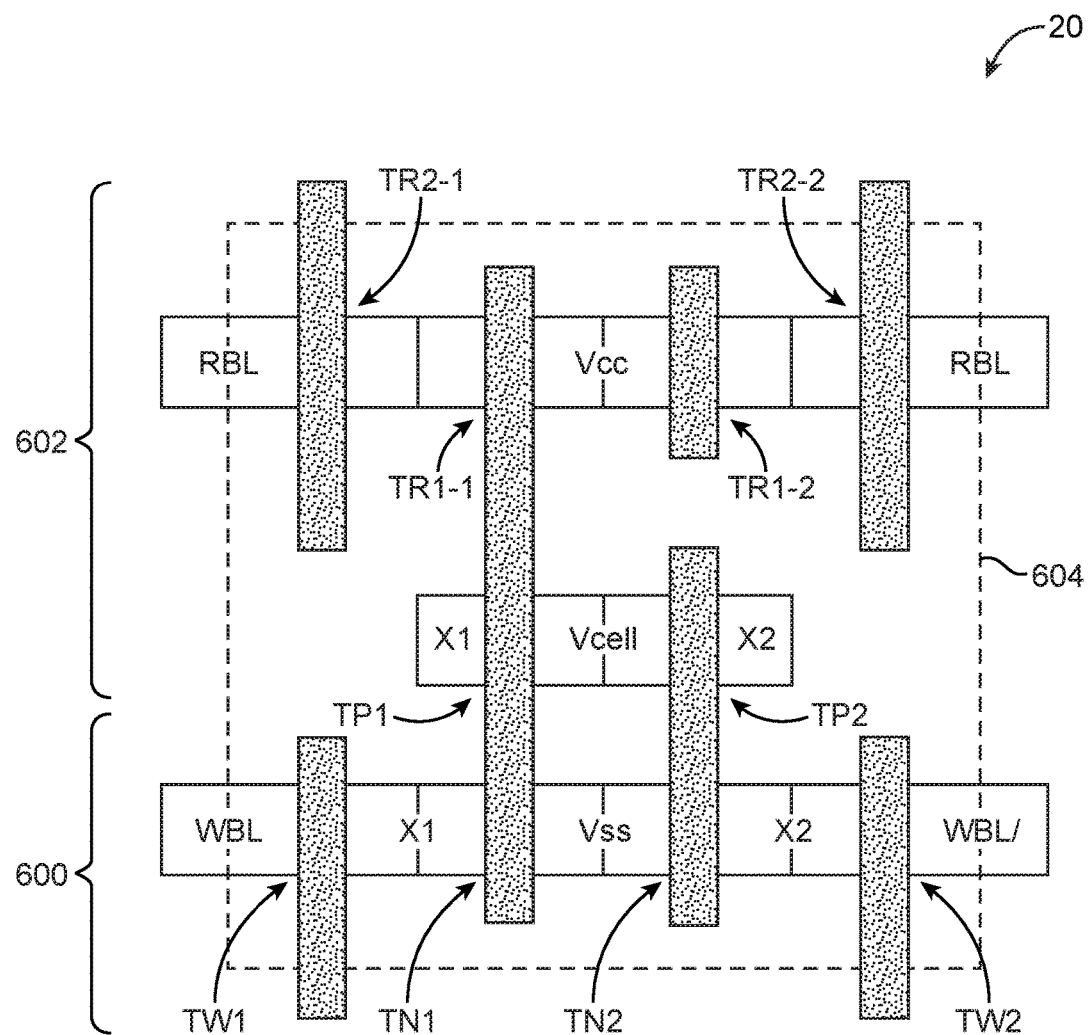
FIG. 6 is a top layout view of a memory cell of the type shown in FIG. 3 that supports row-wise power supply gating in accordance with an embodiment.

In order to implement power supply gating on a per-row basis, however, power supply line 302 should not be formed at the edge of cell 20 but may instead be formed away from the edges to isolate node 302 from adjacent memory cells. This may require a significant layout change, which is illustrated in the top layout view of FIG. 6. As shown in FIG. 6, n-channel transistors TW1, TW2, TN1, and TN2 are formed in region 600, whereas the p-channel transistors are formed in region 602. In this particular arrangement, the read buffer circuit actually includes transistors TR1-1, TR1-2, TR2-1, and TR2-2. Transistors TR1-1 and TR1-2 are connected in parallel and have gate terminals that are shorted to one another. Transistors TR2-1 and TR2-2 are connected in parallel and have gate terminals that are shorted to each another. Connected in this way, transistors TR1-1 and TR1-2 collectively serve as one larger transistor TR1, whereas transistors TR2-1 and TR2-2 collectively serve as one larger transistor TR2 in the read buffer circuit (see, e.g., FIG. 3).

Note that write bit lines WBL and WBL/, read bit line RBL, and the power supply lines carrying Vcc and Vss are formed near the edge 604 of memory cell 20. The Vcell node, however, is formed near the center of the memory cell layout. By forming the cell supply node (i.e., node 302 in FIG. 3) at the center and away from the border of memory cell 20, the row control line tapping and providing voltage Vcell to bias that cell supply node will not be shared between adjacent rows, which enables Vcell gating on a per-row basis. In contrast to the conventional elongated memory cell layout, the layout of memory cell 20 shown in FIG. 6 is substantially more square-like. Consider that the memory cell layout of FIG. 6 has dimensions measuring L by W microns (from the top layout perspective). If the cell layout is a perfect square, the ratio of L:W may be equal to one. As other examples, the ratio of L:W may generally be less than 5:1, less than 4:1, less than 3:1, less than 2:1, less than 1.5:1, less than 1.2:1, etc. In contrast to an elongated memory cell layout, a more balanced (i.e., squarish) memory cell aspect ratio allows for better power delivery since more power rails can be strapped across each cell in both row and column directions.

The exemplary memory cell layout shown in FIG. 6 is merely illustrative and does not limit the scope of the present embodiments. If desired, memory cell 20 may be formed using any other suitable arrangement so long as the gating of the memory cell supply node receiving Vcell can be performed on a row-by-row basis. If desired, memory cell 20 may also be formed in a more elongated fashion.

Figure 7:
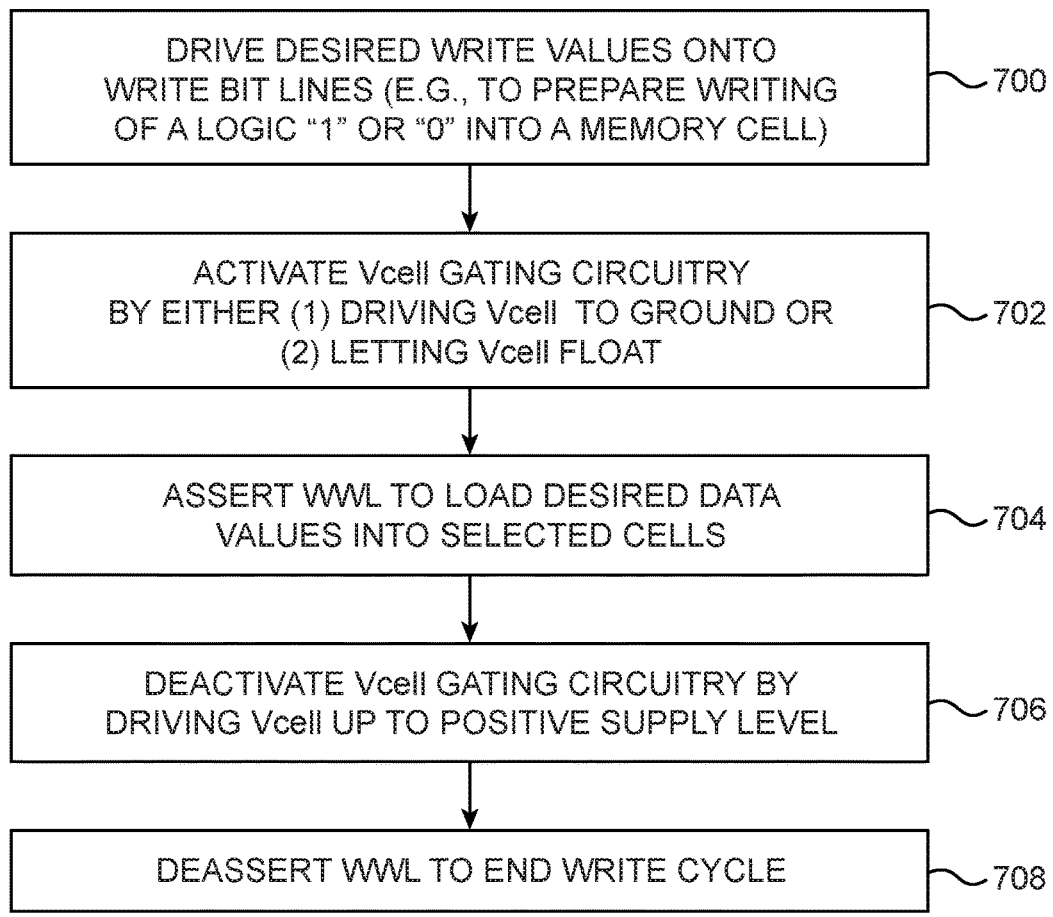
FIG. 7 is a flow chart of illustrative steps for operating memory circuitry of the type shown in FIGS. 1-6 in accordance with an embodiment.

FIG. 7 is a flow chart of illustrative steps for loading data into memory cells of the type shown in FIGS. 1-6. At step 700, write drivers may be used to drive desired write data values onto the write bit lines. For example, write bit line WBL may be driven high while complementary write bit line WBL/ may be driven low to write a logic "1" into memory cell 20. As another example, write bit line WBL may be driven low while complementary write bit line WBL/may be driven high to load a logic "0" into memory cell 20.

At step 702, memory cell power supply gating circuitry 350 may be activated by either: (1) driving the memory cell supply voltage Vcell in the selected row to ground or (2) letting the Vcell node float by temporarily cutting off the pull-up current path for memory cells in the selected row.

At step 704, the write word line in the selected row may then be asserted to load the desired data values from the bit lines into the selected memory cells in that row. At step 706, memory cell power supply gating circuitry 350 may then be deactivated by driving the Vcell node back up to positive power supply level (e.g., back up to Vcc or other elevated overdrive voltage level). At step 708, the write word line may then be deasserted to end the current write cycle.

The steps of FIG. 7 are merely illustrative. The existing steps may be modified or omitted; some of the steps may be performed in parallel; additional steps may be added; and the order of certain steps may be reversed or altered, if desired.

The examples above in which the row-wise memory cell supply gating circuitry is applied to 8T memory cells are merely illustrative and do not serve to limit the scope of the present invention. Configured and operated in this way, the write-ability and write speed of the memory array can be drastically improved because there is no longer any drive fight between the n-channel access (or pass-gate) transistor and the p-channel pull-up transistor. This can also help obviate the need for peripheral write assist mechanisms, thereby reducing the complexity and area of the memory control circuitry.

If desired, the same write assist techniques may also be extended to 6-transistor (6T) memory cells, 10-transistor (10T) memory cells, random-access memory cells with any suitable number of transistors, etc. For 6T memory cells, because the read and write ports are shared, a separate row control line that is dependent of the word line will have to be included since the Vcell power line is only gated during write operations but not during read operations.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit, comprising:
an array of memory cells arranged in rows and columns, wherein each memory cell in the array includes inverting circuits having a power supply terminal; and
power supply gating circuitry that is coupled to the power supply terminal in each memory cell along a selected row of memory cells in the array, wherein:
the power supply gating circuitry is activated when writing data into the selected row of memory cells;
when the power supply gating circuitry is deactivated, the power supply gating circuitry provides a positive power supply voltage to the power supply terminal in each memory cell along the selected row; and
when the power supply gating circuitry is activated, the power supply gating circuitry provides a ground power supply voltage to the power supply terminal in each memory cell along the selected row.

2. The integrated circuit of claim 1, wherein the array of memory cells comprises an array of random-access memory cells.

3. The integrated circuit of claim 2, wherein the random-access memory cells comprises multiport memory cells.

4. The integrated circuit of claim 1, further comprising:
a word line that is coupled to the selected row of memory cells; and
a delay circuit that is coupled between the word line and the power supply terminal in each memory cell along the selected row.

5. The integrated circuit of claim 4, wherein the delay circuit comprises an inverter.

6. The integrated circuit of claim 1, wherein the selected row of memory cells receives a word line signal and also receives a gated power supply signal at the power supply terminal, and wherein the word line signal is a delayed and inverted version of the gated power supply signal.

7. An integrated circuit, comprising:
an array of memory cells arranged in rows and columns, wherein each memory cell in the array includes inverting circuits having a power supply terminal; and
power supply gating circuitry that is coupled to the power supply terminal in each memory cell along a selected row of memory cells in the array, wherein the power supply gating circuitry is activated when writing data into the selected row of memory cells, and wherein when the power supply gating circuitry is activated, the power supply gating circuitry tri-states the power supply terminal in each memory cell along the selected row.

8. The integrated circuit of claim 7, further comprising:
a word line that is coupled to the selected row of memory cells; and a shared pull-up transistor having a gate terminal that is connected to the word line and a drain terminal that is connected to the power supply terminal in each memory cell along the selected row.

9. The integrated circuit of claim 1 or 7, wherein each memory cell in the array has a square-like layout.

10. A method of operating an integrated circuit that includes an array of memory cells, the method comprising:
presenting write data values to the array of memory cells;
gating a power supply line that powers a selected row of memory cells in the array;
asserting a word line signal for the selected row of memory cells, wherein the word line signal also controls the gating of the power supply line; and
while the power supply line is being gated for the selected row of memory cells, loading the write data values into the selected row of memory cells in the array.

11. The method of claim 10, wherein gating the power supply line comprises providing a ground power supply voltage to the selected row of memory cells.

12. The method of claim 10, wherein gating the power supply line comprises at least partially cutting off a pull-up current path for the selected row of memory cells.

13. The method of claim 10, further comprising:
after gating the power supply line, providing a positive power supply voltage to the selected row of memory cells.

14. The method of claim 10, further comprising toggling the power supply line, wherein the word line signal is asserted in response to toggling the power supply line.

\* \* \* \* \*